(12) United States Patent
Chen et al.

(10) Patent No.: US 6,664,599 B1
(45) Date of Patent: Dec. 16, 2003

(54) ESD PROTECTION DEVICE

(75) Inventors: Wei-Fan Chen, Taichung (TW);
Shi-Tron Lin, Taipei (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 10/281,660

(22) Filed: Oct. 28, 2002

(51) Int. Cl.[7] ............................................. H01L 23/62
(52) U.S. Cl. ...................................... 257/355; 257/355
(58) Field of Search ................................. 257/355, 362, 257/356, 603, 369, 544, 402; 438/218

(56) References Cited

U.S. PATENT DOCUMENTS 5,742,083 A * 4/1998 Lin ............................ 257/355

2002/0076876 A1 * 6/2002 Ker et al. ................... 438/218

* cited by examiner

*Primary Examiner*—David Nelms
*Assistant Examiner*—Thinh T. Nguyen
(74) *Attorney, Agent, or Firm*—Raymond Sun

(57) ABSTRACT

An electrostatic discharge (ESD) protection device has a semiconductor bulk of a first conductivity type, a first doped region of a second conductivity type formed in the semiconductor bulk, a second doped region of a second conductivity type formed in the semiconductor bulk, a channel region formed between the first doped region and the second doped region, a plurality of contacts formed on the first doped region, and a well of the second conductivity type formed in the semiconductor bulk and positioned between the channel and the contacts.

32 Claims, 8 Drawing Sheets

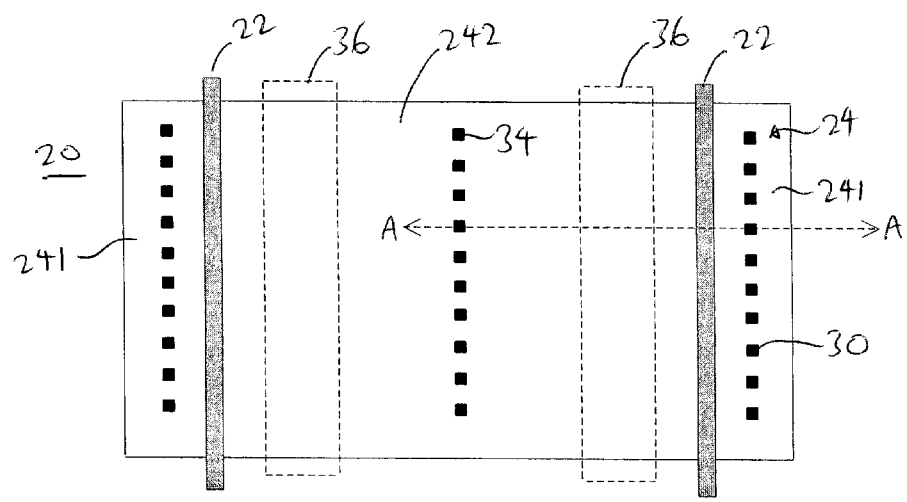
(Fig. 1A)
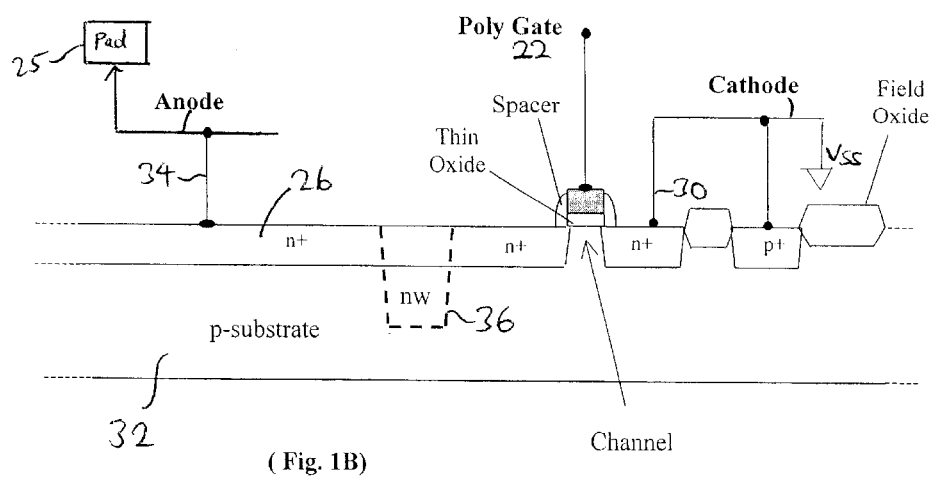
(Fig. 1B)

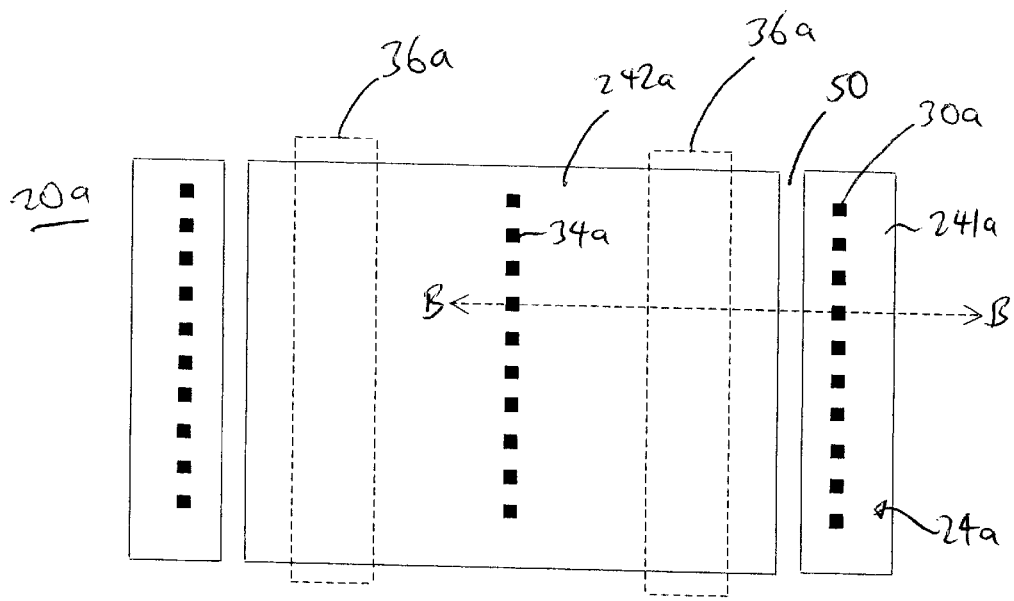
(Fig. 2A)
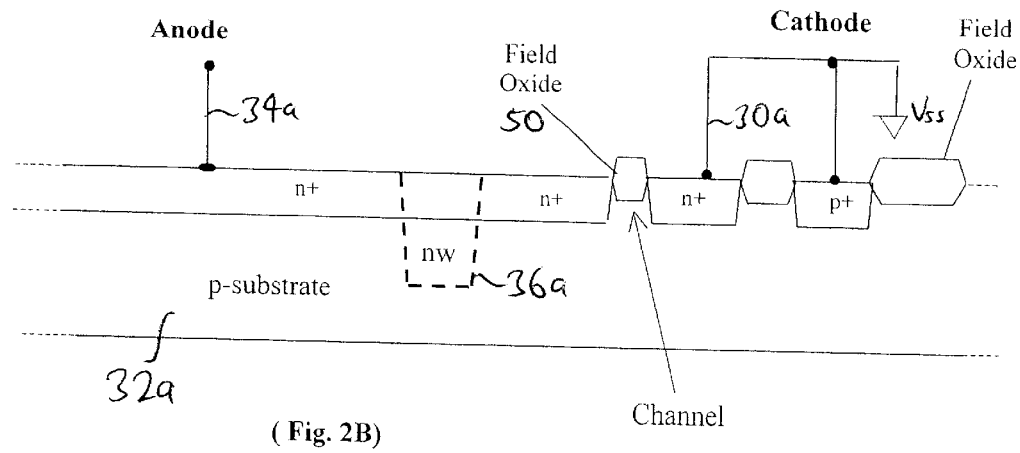
(Fig. 2B)

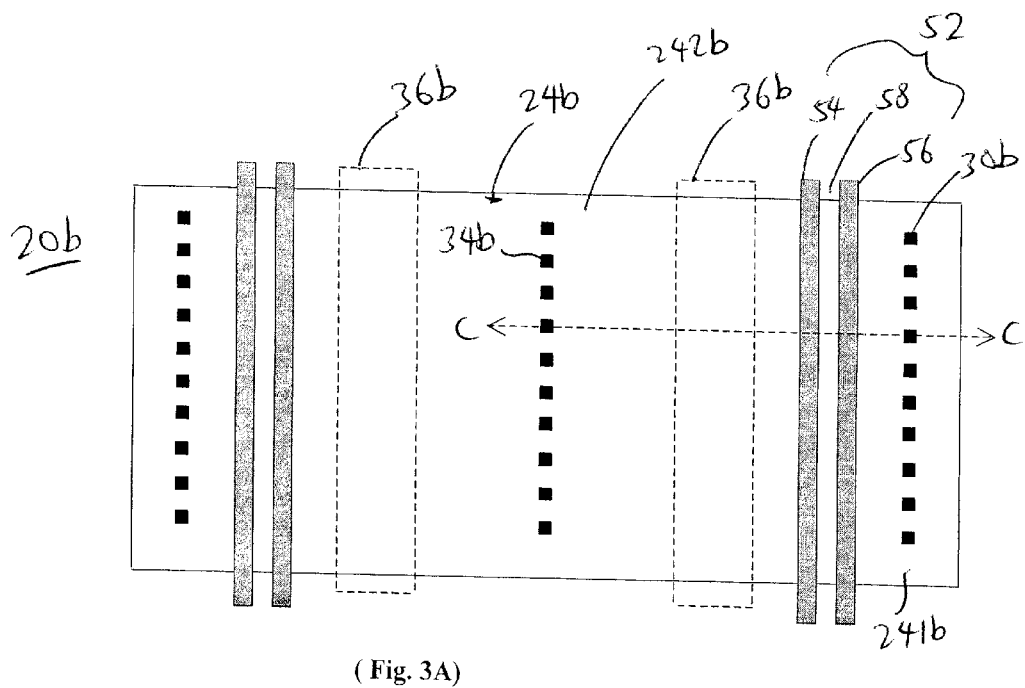
(Fig. 3A)
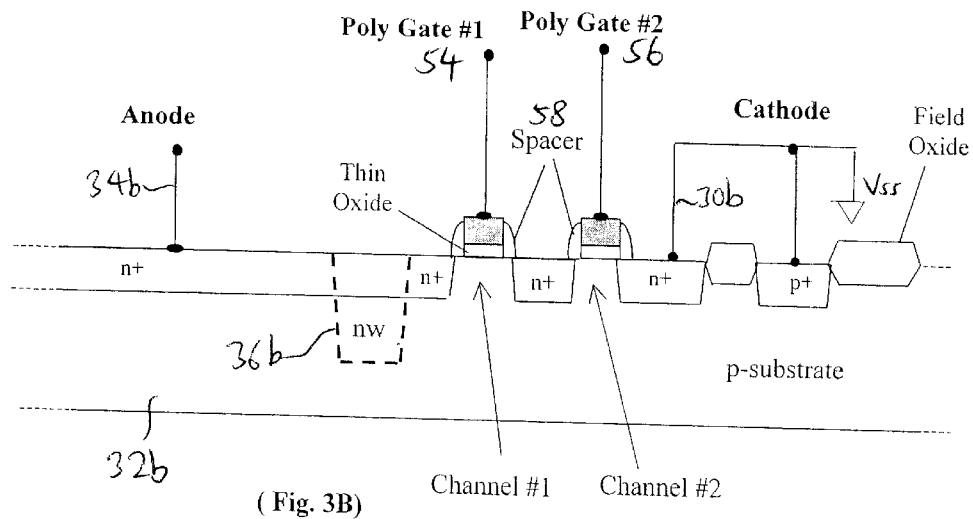
(Fig. 3B)

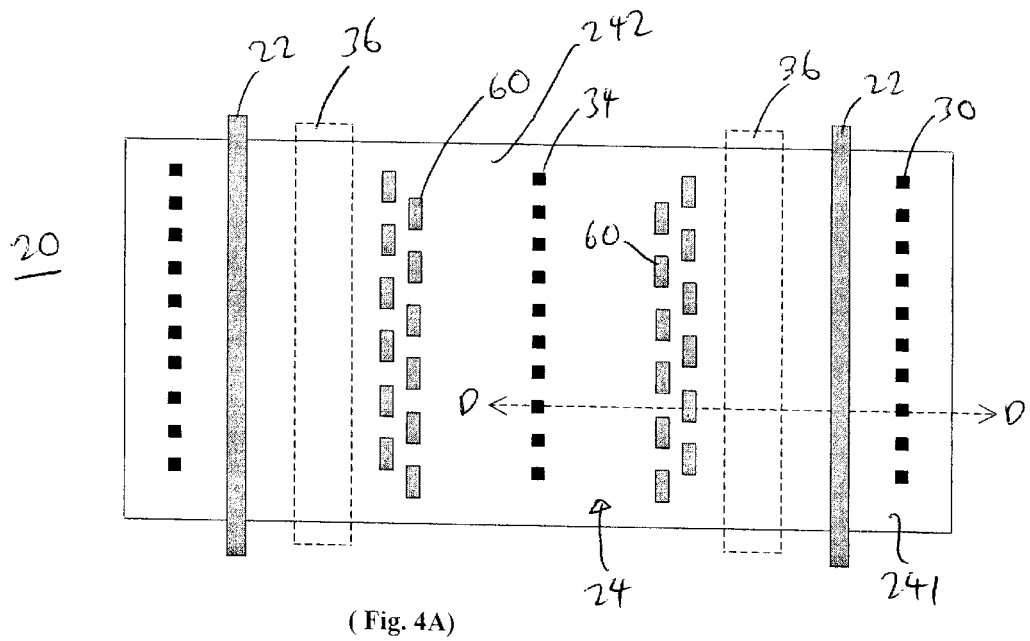
(Fig. 4A)
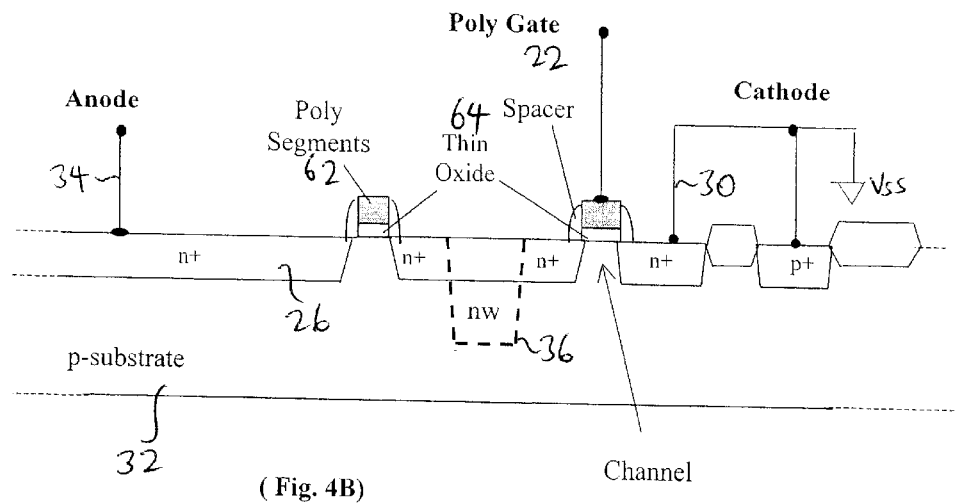
(Fig. 4B)

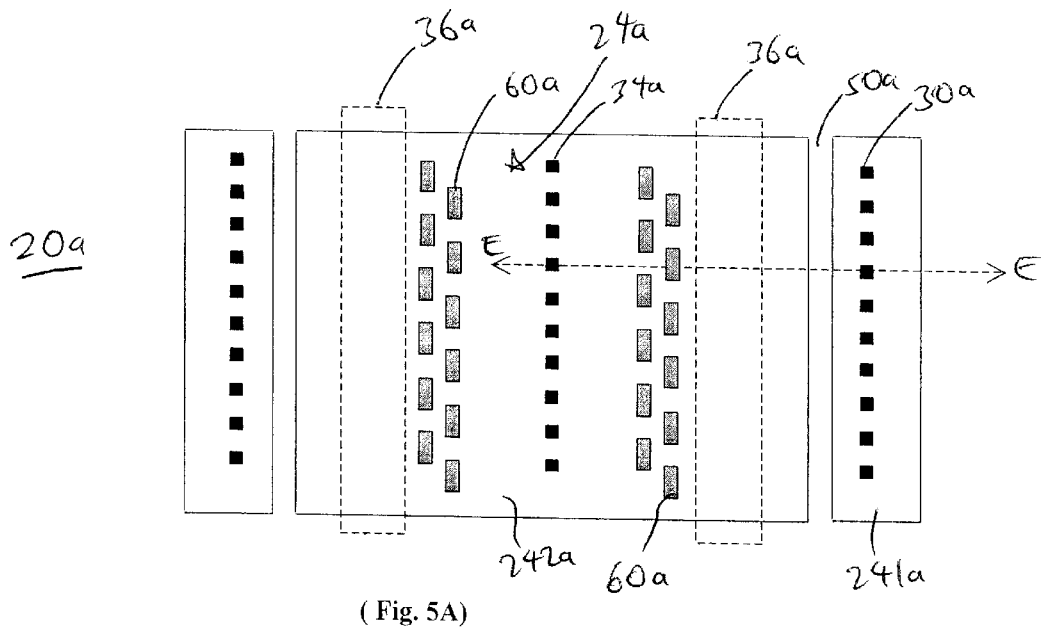
(Fig. 5A)
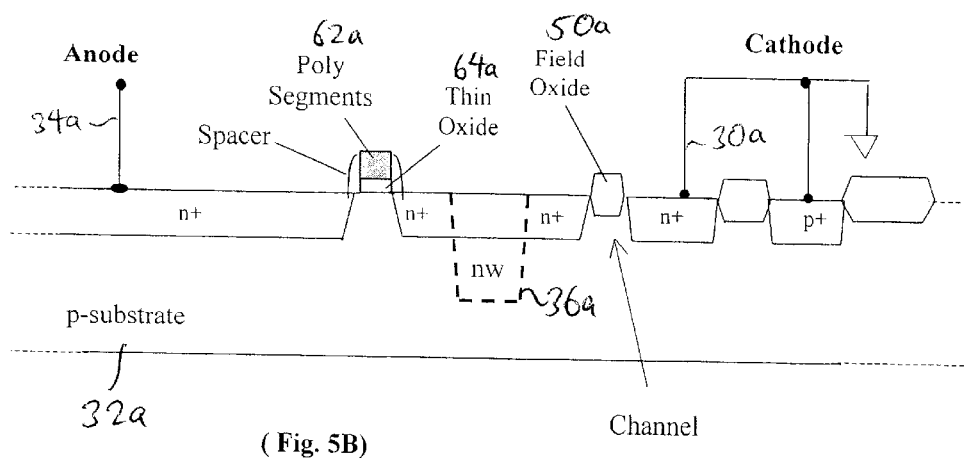
(Fig. 5B)

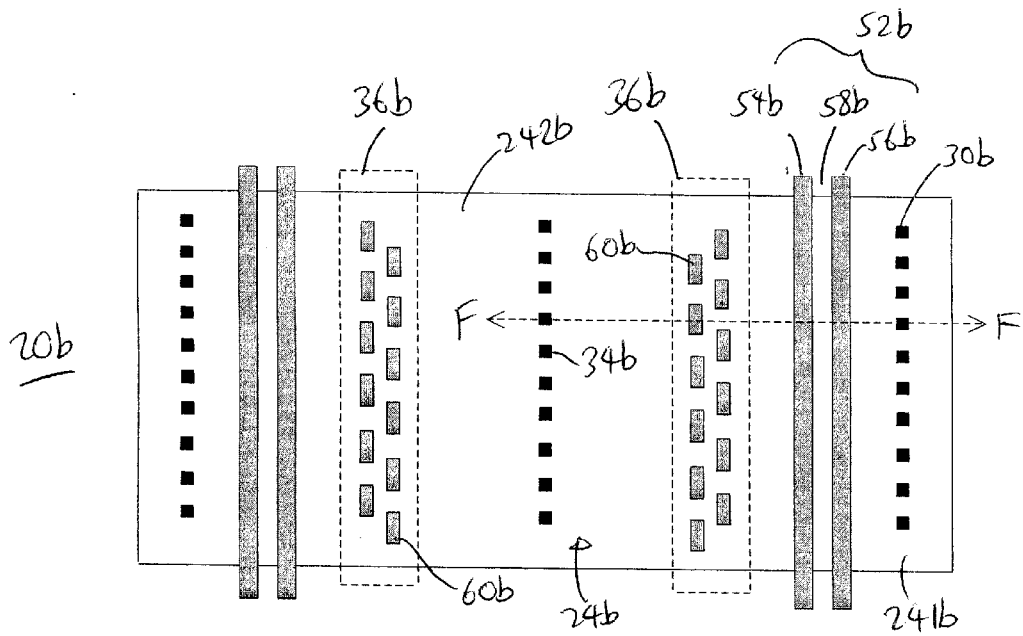
(Fig. 6A)
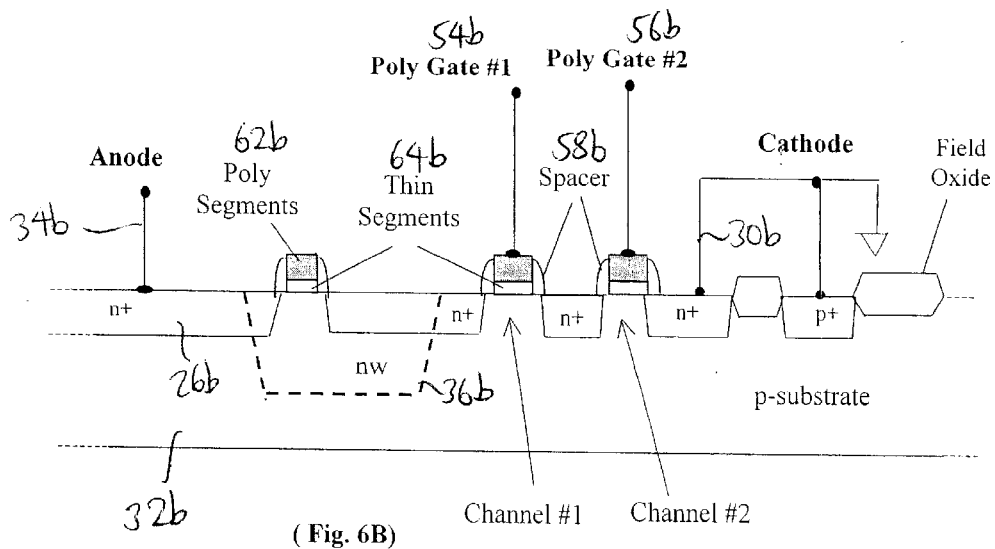
(Fig. 6B)

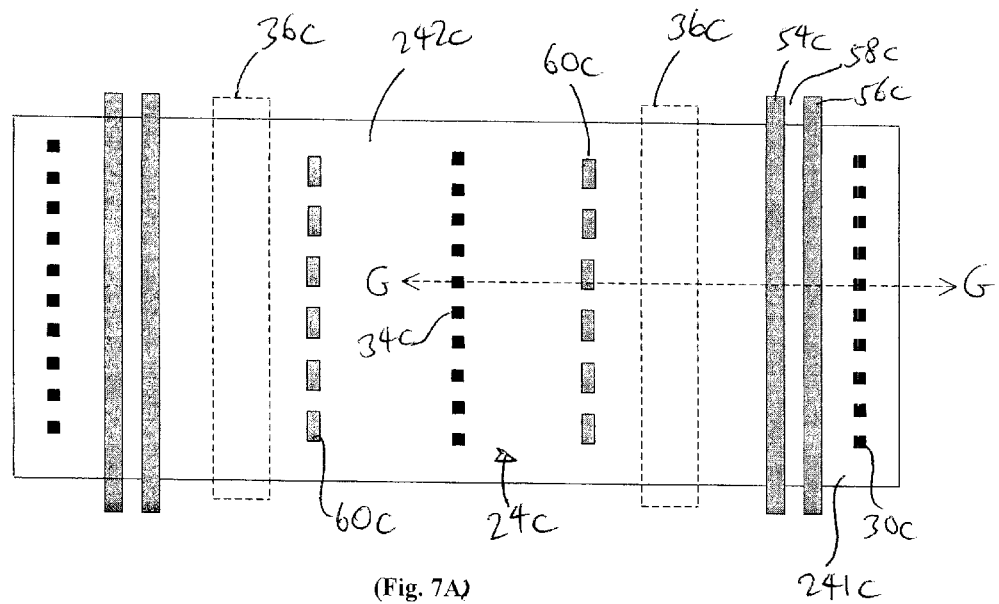
(Fig. 7A)
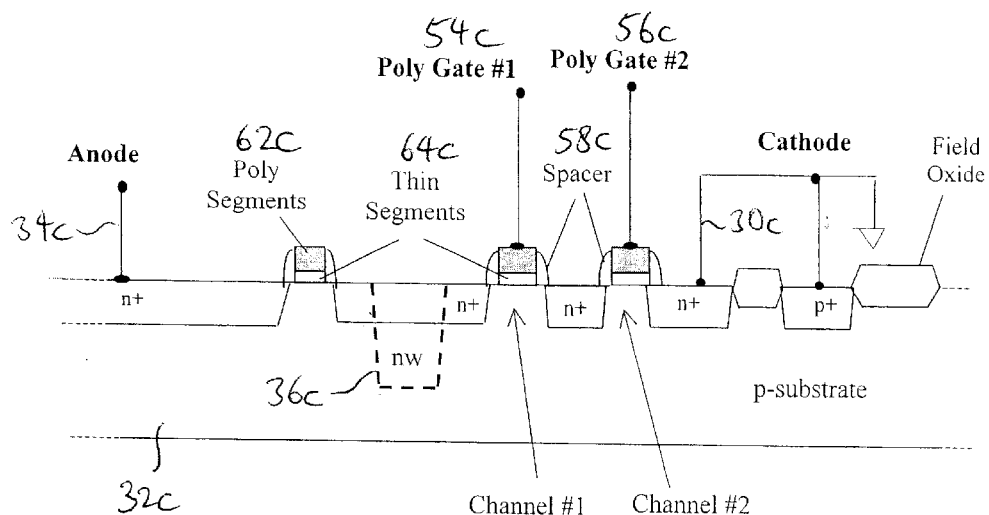
(Fig. 7B)

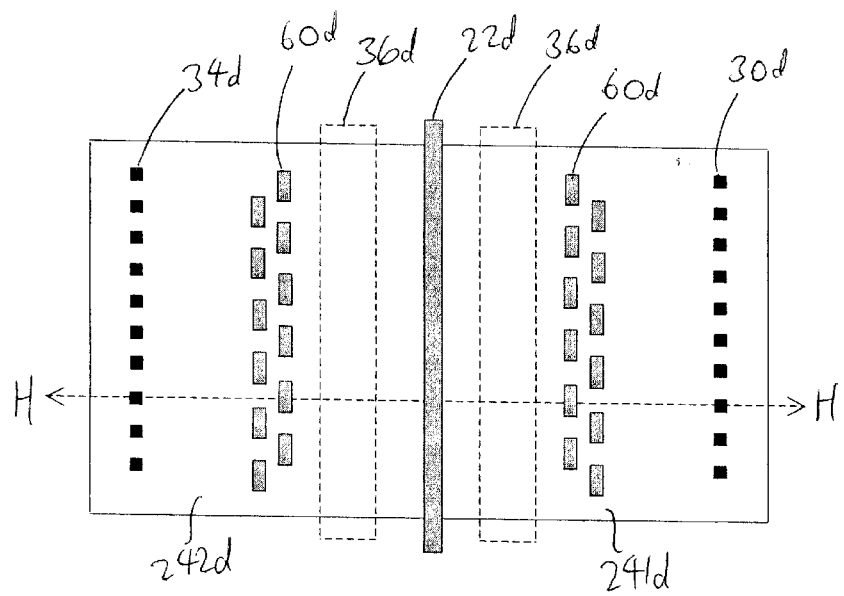
(Fig. 8A)
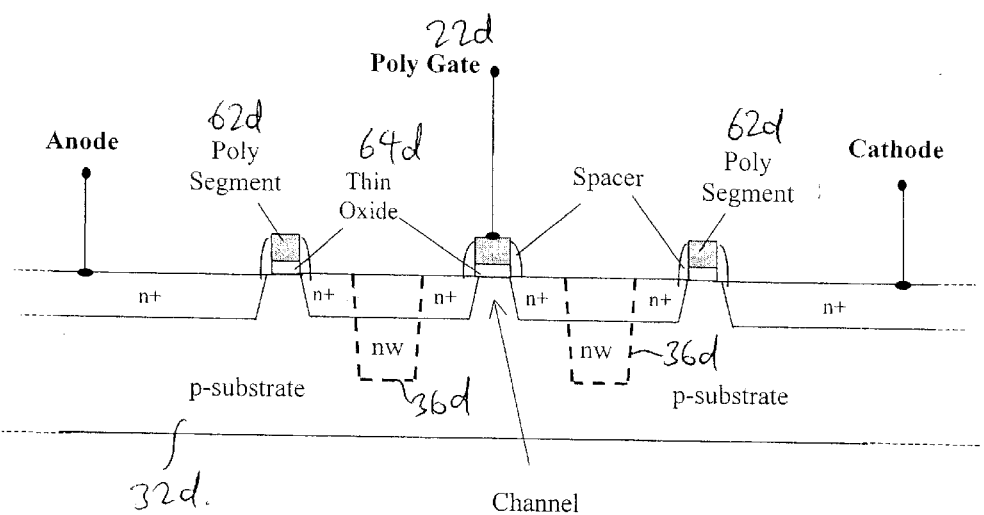
(Fig. 8B)

ESD PROTECTION DEVICE

BACKGROUND OF THE INVENTION

1. Field of the Invention

The present invention relates to electro-static discharge (ESD) protection devices in semiconductor integrated circuit (IC) devices, and in particular, to ESD protection devices and wells thereunder for the prevention of substrate leakage.

2. Background Art

As products based on ICs become more delicate, they also become more vulnerable to the effects of the external environment, and especially to ESD stress occurring when one pin of an IC is grounded and another pin of the IC contacts an electrostatically-precharged object. Therefore, input pins, output pins, input/output (I/O) pins, and power bus pins for an IC communicating with external systems must be provided with ESD protection devices or circuitry to meet the minimum level of ESD robustness required by commercial applications.

NMOS devices, either with the gate grounded or with the gate coupled to a positive voltage during an ESD event, have commonly been used as primary ESD protection devices for ICs. It is well known that the drain contact of an NMOS device must be kept a few microns apart from the gate of the NMOS device. What is implied is that the drain side of an NMOS device confronting ESD stress in the front line must have a distributed resistor connected in series between the channel under the gate and a coupled pad, and the resistance of the distributed resistor must be larger than an acceptable value. If the ESD transient current starts to localize at a weak spot near the gate, it causes the entire ESD current to rush in, thereby causing local heating and eventually damaging the NMOS device. On the other hand, the distributed resistor helps to raise the potential of the adjacent diffusion area, and hence induce a more uniform ESD current flow towards the whole channel.

It was also known that an n-well layer can be disposed under the contact area of a drain region to avoid Aluminum spiking under a high-heat, high-current, ESD event. However, with the improvements in contact technology, such as using a Tungsten plug, the issue of Aluminum spiking is reduced. On the other hand, the deep n-well is effective in collecting minority carriers (electrons) during a positive-voltage pad-to-VSS ESD event. Unfortunately, due to the intrinsic property of the n-well, the n-well resistance decreases in response to local current/heating which causes local temperature increase, which in turn prompts further reduction of local resistance and increased local current/heating/temperature-rising. As a result, the ESD current flowing in the n-well can be highly non-uniform during an ESD transient. If the n-well is disposed immediately underneath the contacts, the highly non-uniform current flow into the plurality of contacts can cause an adverse effect towards degrading the ESD protection level.

Therefore, there remains a need for an improved ESD protection device that overcomes the drawbacks set forth above.

SUMMARY OF THE INVENTION

It is an object of the present invention to provide an improved ESD protection device.

It is another object of the present invention to provide a more effective positioning for N-wells in the P-sub region.

To accomplish the objectives of the present invention, there is provided an electrostatic discharge (ESD) protection device having a semiconductor bulk of a first conductivity type, a first doped region of a second conductivity type formed in the semiconductor bulk, a second doped region of a second conductivity type formed in the semiconductor bulk, a channel region formed between the first doped region and the second doped region, a plurality of contacts formed on the first doped region, and a well of the second conductivity type formed in the semiconductor bulk and positioned between the channel and the contacts. In different embodiments of the present invention, the channel region formed between the first doped region and the second doped region can be formed under by a stripe of field oxide or a gate oxide. One or more islands can be formed on the first doped region.

BRIEF DESCRIPTION OF THE DRAWINGS

The invention can be more fully understood by reading the subsequent detailed description of the preferred embodiments, with reference made to the accompanying drawings.

FIG. 1A is a layout of an ESD protection device according to one embodiment of the present invention.

FIG. 1B is a cross-sectional view of the ESD protection device of FIG. 1A taken along line A—A.

FIG. 2A is a layout of an ESD protection device according to another embodiment of the present invention.

FIG. 2B is a cross-sectional view of the ESD protection device of FIG. 2A taken along line B—B.

FIG. 3A is a layout of an ESD protection device according to another embodiment of the present invention.

FIG. 3B is a cross-sectional view of the ESD protection device of FIG. 3A taken along line C—C.

FIG. 4A is a layout of the ESD protection device of FIG. 1A illustrating the inclusion of islands.

FIG. 4B is a cross-sectional view of the ESD protection device of FIG. 4A taken along line D—D.

FIG. 5A is a layout of the ESD protection device of FIG. 2A illustrating the inclusion of islands.

FIG. 5B is a cross-sectional view of the ESD protection device of FIG. 5A taken along line E—E.

FIG. 6A is a layout of the ESD protection device of FIG. 3A illustrating the inclusion of islands.

FIG. 6B is a cross-sectional view of the ESD protection device of FIG. 6A taken along line F—F.

FIG. 7A is a layout of an ESD protection device that illustrates modifications made to the device of FIG. 6A.

FIG. 7B is a cross-sectional view of the ESD protection device of FIG. 7A taken along line G—G.

FIG. 8A is a layout of an ESD protection device that illustrates modifications made to the device of FIG. 4A.

FIG. 8B is a cross-sectional view of the ESD protection device of FIG. 8A taken along line H—H.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known or conventional data processing techniques, hardware devices and circuits are omitted so as to not obscure the description of the present invention with unnecessary detail. The present invention provides an ESD protection device having a N-well that is positioned between the gate (or field oxide device) and the contacts within a diffusion region.

FIG. 1A is a top view of the layout of an ESD protection device according to one embodiment of the present invention. The ESD protection device 20 can be a multi-finger-type NMOS with two poly gates 22 coupled together. An active region 24 is surrounded by an isolation region, which is typically formed by a field oxide region or a shallow-trench isolation (STI) region. The active region 24 is typically ion-implanted by negative-type ions and then annealed by thermal cycles to form heavily n-doped (n+) regions 26. Such ion implant is blocked by any poly gate, poly element or field oxide segment present within the active region. Within the active region 24, two channel regions under the poly gates 22 are formed. The portion of the active region 24 between the two poly gates 22 is referred to as the drain diffusion region 242, serving as an anode and coupled to a pad 25, and the portions of the active region 24 sandwiching the two poly gates 22 in between are referred to as source diffusion regions 241, serving as a cathode and coupled to a Vss power rail. The source and drain diffusion regions 241, 242 are separated by the poly gates 22 as well as the channels underneath the poly gates 22.

FIG. 1B is a cross-sectional view of the ESD protection device 20 of FIG. 1A taken along line A—A. The ESD protection device 20 has a p-well/p-substrate (P-sub) 32. When viewed from the right side, there are source contacts 30 in the source diffusion region 241, a poly gate 22, and drain contacts 34 in the drain diffusion region 242. The drain diffusion region 242 is coupled to the pad 25, and the source diffusion region 241 and the P-sub 32 are coupled to the Vss power rail. One or more deep n-well regions 36 overlap with part of the drain diffusion region 242. As illustrated in FIGS. 1A and 1B, each n-well 36 is positioned between the poly gate 22 and the drain contact 34. In other words, the n-well 36 is spaced apart from both the poly gate 22 and the drain contact 34.

If the n-well 36 is too close to the poly gate 22, punch-through may occur during power-on IC operation due to the wider junction of the n-well 36. Therefore, the n-well 36 is spaced apart from the poly gate 12 by a minimum distance, which can vary depending on the process. As one non-limiting example, the n-well 36 can be spaced apart from the poly gate 22 by 0.6 um for 0.35 um process technology.

The structure in FIGS. 1A and 1B provides several benefits. First, the n-well 36 is effective in collecting minority carriers into the drain diffusion region 242. Then, with the assistance of the n+ diffusion resistance (and the provision of islands 60 in the drain diffusion region 242, as shown in FIGS. 4A and 4B below), the overall current flowing in the drain diffusion region 242 can become more uniform for improving the overall ESD robustness. This is because the minority carriers injected from the source region 241 in the P-sub 32 are collected by the n-well 36 and then guided through the distributed resistance network formed by the n+ diffusion region 26 (or around the islands 60 in the drain diffusion region 242).

Second, the structure in FIGS. 1A and 1B provides a lower drain capacitance. Since the n-well 36 has a lower doping concentration than the n+ region 26 in the drain diffusion region 242, the n-well 36 to P-sub 32 capacitance is much lower than the n+ region 26 to P-sub 32 capacitance, so that the resultant drain-to-substrate capacitance in the structure in FIGS. 1A and 1B is much lower than the same structure without the overlapping n-well 36.

FIGS. 2A and 2B illustrate another embodiment of an ESD protection device 20a according to the present invention. FIGS. 2A and 2B are similar to FIGS. 1A and 1B, so the same numeral designations shall be used in FIGS. 1A, 1B, 2A and 2B to designate the same elements except that the numerals in FIGS. 2A and 2B shall include an "a". In this regard, the NMOS device in FIGS. 1A and 1B is now replaced by a field-oxide device 50 in FIGS. 2A and 2B. The field oxide device 50 having a channel under the field oxide is also a lateral-bipolar device as shown in FIG. 2B.

In FIGS. 2A and 2B, an active region 24a is surrounded by an isolation region, which is typically formed by a field oxide region or a shallow-trench isolation (STI) region. The active region 24a has an emitter region 241a and a collector region 242a that are separated by the field oxide device 50. Contacts 30a are provided in the emitter region 241a, and contacts 34a are provided in the collector region 242a. One or more n-well regions 36a overlap with part of the collector region 242a, and each n-well region 36a is positioned between the field oxide device 50 and the contacts 34a. In other words, each n-well region 36a is spaced apart from both the field oxide device 50 and the contacts 34a.

FIGS. 3A and 3B illustrate another embodiment of an ESD protection device 20b according to the present invention. FIGS. 3A and 3B are similar to FIGS. 1A and 1B, so the same numeral designations shall be used in FIGS. 1A, 1B, 3A and 3B to designate the same elements except that the numerals in FIGS. 3A and 3B shall include a "b". In this regard, the NMOS device in FIGS. 1A and 1B is now replaced by a stack MOS 52 in FIGS. 3A and 3B that has two poly gates 54 and 56, each having a spacer 58 on the side wall.

In FIGS. 3A and 3B, an active region 24b is surrounded by an isolation region as in FIGS. 1A and 1B. Within the active region 24b, two serially connected channel regions are formed under the stack NMOS 52 (see FIG. 3B). The portion of the active region 24b between the two stack NMOS 52 is referred to as the drain diffusion region 242b, and the portions of the active region 24b sandwiching the two stack NMOS 52 in between are referred to as source diffusion regions 241b. The source and drain diffusion regions 241b, 242b are separated by the stack NMOS 52 as well as the channels underneath them. The ESD protection device 20b also has a P-sub 32b. When viewed from the right side, there are source contacts 30b in the source diffusion region 241b, the poly gates 54, 56 and the spacers 58, and then drain contacts 34b in the drain diffusion region 242b. One or more n-well regions 36b overlap with part of the drain diffusion region 242b, and each is positioned between each stack NMOS 52 and the drain contact 34b. In other words, the n-well 36b is spaced apart from both the stack NMOS 52 and the drain contact 34b.

For the stacked-gate structure illustrated in FIGS. 3A and 3B, the use of two separate gates 54, 56 instead of merely one gate (e.g., 22) results in further spacing apart the drain and source regions 242b and 241b, respectively. This further spacing reduces the gain of the lateral bipolar (formed by drain-substrate-source as the collector-base-emitter for the bipolar device) due to increased collector-to-emitter spacing, so that the ESD performance is also reduced. On the other hand, the deep n-well 36b improves the gain of the lateral bipolar device as the bipolar gain increases with the collector's carrier-collecting area.

Provision of Islands

At this point, the term "island" will be defined. Before defining the term, it is noted that an island generally performs the function of directing or diverting a portion of electrical current from a contact to near a channel.

An island can be considered as a structure or arrangement that divides or diverts electrical current. An island can be a physical structure that overlaps (either partially or completely) with an active source/drain (S/D) region. Here, an active S/D region can be defined as a region enclosed by surrounding isolation and a channel region. An island can also be a current-routing structure that does not have a clear physical structure, such as poly or field-oxide islands.

An island can also be a region that is fully or partially enclosed by a heavily doped region within an active region. Here, an active region is an active device region that is surrounded by an isolation region. For example, the source, drain and gate of a MOSFET transistor forming an active region is surrounded by an isolation (field-oxide) region. A heavily doped region can be a diffusion region (as all doped ions tend to diffuse under high temperature processing steps), which can be formed by ion implantation followed by thermal diffusion. Here, examples of an isolation region include LOCOS isolation and trench isolation.

An island may have a physical structure. Non-limiting examples include a dielectric layer over bulk (bulk can be a substrate or a well), or a floating conductive layer over a dielectric layer, or a non-floating conductive layer over a dielectric layer. Another non-limiting example of a physical island is one that at least partially overlaps with an active S/D region (e.g., of a MOSFET device) or an active emitter/collector region (e.g., of a field or bipolar device). Yet another non-limiting example of a physical island is a peninsula-like extension of the surrounding isolation region into a heavily doped region surrounded by the isolation region (i.e., an island extended from the surrounding isolation into an S/D or emitter/collector region).

A non-limiting example of a physical island with a floating conductive element feature has a floating conductor element on a dielectric element, with the floating conductor element at least partially, or fully, overlapping an S/D (or emitter/collector) region. This floating conductor element may also overlap both with an S/D (or emitter/collector) region and with an isolation region.

FIGS. 4A and 4B illustrate the provision of islands 60 to the ESD protection device 20 shown in FIGS. 1A and 1B. Isolated islands 60, consisting of poly segments 62 with thin gate oxide segments 64 thereunder, are distributed in the drain diffusion region 242. None of the islands 60 overlap with the N-well 36, although FIGS. 6A and 6B illustrate an embodiment where the islands overlap with, or are contained inside, the N-well 36. Any number of rows of islands 60 can be provided in the drain diffusion region 242. Although this embodiment illustrates the islands 60 provided solely in the drain diffusion region 242, it is possible to provide islands in the source diffusion region 241, as illustrated in FIGS. 8A and 8B below.

Thus, when viewed from the right side of FIG. 4B, there are source contacts 30 in the source diffusion region 241, a poly gate 22, and then one or more rows of islands 60, drain contacts 34, and one or more rows of islands 60 in the drain diffusion region 242. One or more n-well regions 36 overlap with part of the drain diffusion region 242. Each n-well 36 is still positioned between the poly gate 22 and the drain contact 34, and is spaced apart from both the poly gate 22 and the drain contact 34.

During an ESD event, for example, a positive transient voltage pulse may appear at the anode, and the current flows from the drain contacts 34 in the drain diffusion region 242 toward the edge of the drain diffusion region 242 and the poly gate 22. From the structure shown in FIGS. 4A and 4B, the deep n-well region 36 is effective in collecting minority carriers injected from the source diffusion region 241 into the drain diffusion region 242. Then, with the help from the islands 60 in the drain diffusion region 242, the overall current flowing in the drain diffusion region 242 can become more uniform for improving the overall ESD robustness. This is because the minority carriers injected from the source region 241 in the P-sub 32 are collected by the n-well 36 and then guided through the distributed resistance network formed by the islands 60 in the drain diffusion region 242.

FIGS. 5A and 5B illustrate the provision of islands 60a to the ESD protection device 20a shown in FIGS. 2A and 2B. Isolated islands 60a, consisting of poly segments 62a with thin gate oxide segments 64a thereunder, are distributed in the collector region 242a. None of the islands 60a overlap with the N-well 36a. Any number of rows of islands 60a can be provided in the collector region 242a.

Thus, when viewed from the right side of FIG. 5B, there are contacts 30a in the emitter region 241, the field oxide device 50a, and then one or more rows of islands 60a, contacts 34a, and one or more rows of islands 60a in the collector region 242a. One or more n-well regions 36a overlap with part of the collector region 242a. Each n-well 36a is still positioned between the field oxide device 50a and the contact 34a, and is spaced apart from both the field oxide device 50a and the contact 34a. The benefits of the ESD protection device 20a in FIGS. 5A and 5B are essentially the same as for the ESD protection device 20 in FIGS. 4A and 4B.

FIGS. 6A and 6B illustrate the provision of islands 60b to the ESD protection device 20b shown in FIGS. 3A and 3B. Isolated islands 60b, consisting of poly segments 62b with thin gate oxide segments 64b thereunder, are distributed in the drain diffusion region 242b. All of the islands 60b are positioned inside the N-well 36b, although it is also possible to provide some islands 60b that do not overlap with the N-well 36b (see FIGS. 4A, 4B, 5A and 5B). Any number of rows of islands 60b can be provided in the drain diffusion region 242b.

Thus, when viewed from the right side of FIG. 6B, there are source contacts 30b in the source diffusion region 241b, poly gates 54b, 56b and spacer 58b, and rows of islands 60b and drain contacts 34b in the drain diffusion region 242b. One or more n-well regions 36b still overlap with part of the drain diffusion region 242b, and each is positioned between the stack MOS 52b and the drain contact 34b. In other words, each n-well 36b is still spaced apart from both the stack NMOS 52b and the drain contact 34b.

In FIGS. 6A and 6B, the islands 60b are positioned inside the N-well 36b so as to force the electrons entering the N-well 36b to travel through the n+ region 26b and then around the islands 60b to obtain a more uniform current flow. The islands 60b provided in the N-well 36b also help to avoid ESD current localized within the N-well region 36b, thereby helping to obtain a more uniform ESD current flow.

FIGS. 7A and 7B illustrate another embodiment of an ESD protection device 20c according to the present invention. FIGS. 7A and 7B are similar to FIGS. 6A and 6B, so the same numeral designations shall be used in FIGS. 6A, 6B, 7A and 7B to designate the same elements except that the numerals in FIGS. 7A and 7B shall include a "c". In this regard, instead of all the islands 60b being positioned inside the N-well 36b (as shown in FIGS. 6A and 6B), the islands 60c in FIGS. 7A and 7B do not overlap with the N-well 36c and are positioned in the drain diffusion region 242c. The embodiments in FIGS. 6 and 7 provide different ways of achieving uniform current flow.

FIGS. 8A and 8B illustrate another embodiment of an ESD protection device 20d according to the present invention. FIGS. 8A and 8B are similar to FIGS. 4A and 4B, so the same numeral designations shall be used in FIGS. 4A, 4B, 8A and 8B to designate the same elements except that the numerals in FIGS. 8A and 8B shall include a "d". In this regard, instead of merely providing islands 60 in the drain diffusion region 242 in FIGS. 4A and 4B, the islands 60d in FIGS. 8A and 8B are positioned in both the drain diffusion region 242d and the source diffusion region 241d. For a dual-direction MOSFET, the structure is roughly symmetrical with respect to the drain and source regions. The structure is particularly useful as a dual-direction ESD protection element when the high-voltage ESD pulse can come from either side of the source/drain regions, and either side of the source/drain diffusion regions need to maintain an appropriate contact-to-gate spacing for suitable distributed diffusion resistance.

As a non-limiting example, a dual-direction NMOS transistor can be coupled between a VDDH (3.3 V) power bus and a VDDL (2.5 V) power bus for power pin ESD protection of a multi-supply integrated circuit. In this case, the high ESD zapping voltage can occur in either direction of the VDDH/VDDL pair or the VDDL/VDDH pair of pin terminals.

Other alternatives to the above-described embodiments can also be envisioned by one skilled in the art. For example, the islands 60, 60a, 60b can be made of a poly segment over a dielectric layer (as described above), or an isolation device. Non-limiting examples of isolation devices include a field oxide device which can be a shallow trench isolation device, or a LOCOS isolation device.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. An electrostatic discharge (ESD) protection device, comprising:
   a semiconductor bulk of a first conductivity type;
   a first doped region of a second conductivity type formed in the semiconductor bulk;
   a second doped region of a second conductivity type formed in the semiconductor bulk;
   a channel region formed between the first doped region and the second doped region;
   a plurality of contacts formed on the first doped region; and
   a well of the second conductivity type formed in the semiconductor bulk and positioned between the channel and the contacts.

2. The device of claim 1, wherein the well is spaced apart from the channel and the contacts.

3. The device of claim 1, further including a plurality of islands formed within the first doped region.

4. The device of claim 3, wherein at least one of the plurality of islands is disposed between the well and the contacts.

5. The device of claim 3, wherein the well is disposed between and spaced apart from the plurality of islands and the channel.

6. The device of claim 3, wherein the plurality of islands is a first plurality of islands and the well is a first well, the device further including:
   a second plurality of islands formed within the second doped region; and
   a second well formed in the second doped region.

7. The device of claim 6, wherein:
   the first well is disposed between and spaced apart from the first plurality of islands and the channel; and
   the second well is disposed between and spaced apart from the second plurality of islands and the channel.

8. The device of claim 3, wherein at least one island is disposed within the well.

9. The device of claim 1, wherein the first doped region is coupled to a pad, and the second doped region is coupled to a power rail.

10. The device of claim 3, wherein at least one island comprises a poly segment.

11. The device of claim 3, wherein at least one island comprises an isolation layer.

12. The device of claim 1, further including a gate formed over the channel region.

13. An electrostatic discharge (ESD) protection device, comprising:
    a semiconductor bulk of a first conductivity type;
    a first doped region of a second conductivity type formed in the semiconductor bulk;
    a second doped region of a second conductivity type formed in the semiconductor bulk;
    a stripe of field oxide formed between the first and the second doped regions;
    a plurality of contacts formed on the first doped region; and
    a well of the second conductivity type on the semiconductor bulk and positioned between the stripe of field oxide and the contacts.

14. The device of claim 13, wherein the well is spaced apart from the stripe of field oxide and the contacts.

15. The device of claim 13, further including a, plurality of islands formed on the first doped region.

16. The device of claim 15, wherein at least one of the plurality of islands is disposed between the well and the contacts.

17. The device of claim 15, wherein the well is disposed between and spaced apart from the plurality of islands and the stripe of field oxide.

18. The device of claim 13, wherein the first doped region is coupled to a pad, and the second doped region is coupled to a power rail.

19. The device of claim 15, wherein at least one island comprises a poly segment.

20. The device of claim 15, wherein at least one island comprises an isolation layer.

21. The device of claim 20, wherein the stripe of field oxide is formed from LOCOS process.

22. The device of claim 20, wherein the stripe of field oxide is formed from trench isolation process.

23. An electrostatic discharge (ESD) protection device, comprising:
    a semiconductor bulk of a first conductivity type;
    a first doped region of a second conductivity type formed in the semiconductor bulk;

a second doped region of a second conductivity type formed in the semiconductor bulk;

a first channel region and a second channel region, with the first and second channel regions formed between the first doped region and the second doped region;

a plurality of contacts formed on the first doped region; and a well of the second conductivity type on the semiconductor bulk and positioned between the channel regions and the contacts.

24. The device of claim 23, further comprising first and second gates formed over the first and the second channel regions, respectively.

25. The device of claim 23, wherein the well is spaced apart from the channel regions and the contacts.

26. The device of claim 23, further including a plurality of islands formed on the first doped region.

27. The device of claim 26, wherein at least one of the plurality of islands is disposed between the well and the contacts.

28. The device of claim 26, wherein the well is disposed between and spaced apart from the plurality of islands and the channel regions.

29. The device of claim 26, wherein at least one island is disposed within the well.

30. The device of claim 23, wherein the first doped region is coupled to a pad, and the second doped region is coupled to a power rail.

31. The device of claim 26, wherein at least one island comprises a poly segment.

32. The device of claim 26, wherein at least one island comprises an isolation layer.

* * * * *